(12) United States Patent
Li et al.

(10) Patent No.: US 10,103,351 B1
(45) Date of Patent: Oct. 16, 2018

(54) DISPLAY DEVICE AND METHOD FOR MANUFACTURING THE SAME

(71) Applicant: BOE TECHNOLOGY GROUP CO., LTD., Beijing (CN)

(72) Inventors: Hong Li, Beijing (CN); Baoming Cai, Beijing (CN); Weifeng Zhou, Beijing (CN); Lu Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/808,775

(22) Filed: Nov. 9, 2017

(30) Foreign Application Priority Data

Apr. 20, 2017 (CN) .......................... 2017 1 0263577

(51) Int. Cl.

| | |
|---|---|
| H05K 1/00 | (2006.01) |
| H01L 51/52 | (2006.01) |
| H05K 3/46 | (2006.01) |
| H05K 3/00 | (2006.01) |
| H05K 3/22 | (2006.01) |
| H01L 51/56 | (2006.01) |
| H01L 27/32 | (2006.01) |
| G06F 3/041 | (2006.01) |
| H05K 1/02 | (2006.01) |

(52) U.S. Cl.
CPC ........ *H01L 51/5246* (2013.01); *G06F 3/0412* (2013.01); *H01L 27/323* (2013.01); *H01L 27/3276* (2013.01); *H01L 27/3288* (2013.01); *H01L 51/5281* (2013.01); *H01L 51/56* (2013.01); *H05K 1/028* (2013.01); *H05K 3/0044* (2013.01); *H05K 3/22* (2013.01); *H05K 3/4644* (2013.01); *G06F 2203/04102* (2013.01); *H01L 2251/5338* (2013.01); *H05K 2201/0257* (2013.01); *H05K 2201/10128* (2013.01); *H05K 2203/0228* (2013.01)

(58) Field of Classification Search
CPC ... H01L 51/5246; H01L 51/56; H01L 27/323; H01L 51/5281; H01L 27/3276; H01L 27/3288; H01L 2251/5338; G06F 2203/04102; G06F 3/0412; H05K 3/4644; H05K 3/0044; H05K 3/22; H05K 2201/0257; H05K 2203/0228; H05K 2201/10128; H05K 1/028
USPC ......................................................... 361/749
See application file for complete search history.

(56) References Cited

U.S. PATENT DOCUMENTS

2015/0022979 A1* 1/2015 Kang ................ G02F 1/133308
361/749
2015/0185527 A1* 7/2015 Chang ................... H01L 27/323
349/12

* cited by examiner

*Primary Examiner* — Sherman Ng
(74) *Attorney, Agent, or Firm* — Kinney & Lange, P.A.

(57) ABSTRACT

A display device and a method for manufacturing a display device are provided. The method includes: forming a material layer on a first face of a display panel; forming a touch panel and a polarizer sequentially on a second face of the display panel, the display panel having an end projecting beyond lateral faces of the touch panel and the polarizer; removing a portion of the material layer located in a first area on the display panel, the first area being located out of an effective display region of the display panel; and bending the first area of the display panel towards the first face such that a second area and a third area of the display panel are located on both sides of the material layer respectively, wherein the second area and the third area are connected to two ends of the first area respectively.

19 Claims, 10 Drawing Sheets

DISPLAY DEVICE AND METHOD FOR MANUFACTURING THE SAME

CROSS-REFERENCE TO RELATED APPLICATION

This application claims priority of the Chinese Patent Application No. 201710263577.5, filed with the State Intellectual Property Office of China on Apr. 20, 2017, which is incorporated herein by reference in its entirety.

BACKGROUND OF THE DISCLOSURE

Field of the Disclosure

The present application relates to the technical field of display, and in particular, to a display device and a method for manufacturing a display device.

Description of the Related Art

A flexible display is made from flexible material and is a deformable and bendable display device, for example, a flexible organic light-emitting diode (abbreviated as OLED) display device. The flexible OLED display device (such as a flexible active matrix organic light emitting diode (abbreviated as AMOLED) display device) has drawn attention broadly due to its characteristics such as high response speed, high contrast, wide field of view and flexibility.

In the related art, the flexible AMOLED display device may be regarded as an example. The flexible AMOLED display device includes a support film. Optical clear adhesive (abbreviated as OCA), a display panel, a touch panel and a polarizer are provided sequentially on the support film. An end of the display panel is connected to a flexible printed circuit board (abbreviated as FPC) by a chip on film (abbreviated as COF). The display panel includes polyimides (abbreviated as PI) substrate.

SUMMARY

An embodiment of the present disclosure provides a method for manufacturing a display device, the method including: forming a material layer on a first face of a display panel; forming a touch panel and a polarizer sequentially on a second face of the display panel, the display panel having an end projecting beyond lateral faces of the touch panel and the polarizer, the second face being opposite to the first face; removing a portion of the material layer located in a first area on the display panel, the first area being located out of an effective display region of the display panel; and bending the first area of the display panel towards the first face of the display panel such that a second area and a third area of the display panel are located on both sides of the material layer respectively, wherein the second area is connected to one end of the first area and the third area is connected to the other end of the first area.

In an embodiment, the material layer and the display panel have a same length.

In an embodiment, a flexible circuit board is formed at an end of the second face of the display panel and the first area is arranged at a side of the display panel towards the flexible circuit board, the second area adjoining the flexible circuit board.

In an embodiment, the second area of the display panel is parallel to the third area of the display panel.

In an embodiment, the material layer includes an optical adhesive layer and a support film, the forming the material layer on the first face of the display panel including: forming the optical adhesive layer on the support film; processing a portion of the optical adhesive layer located in the first area to reduce viscosity of the portion; and adhering the support film to the first face of the display panel by the processed optical adhesive layer.

In an embodiment, the support film and the display panel have a same length.

In an embodiment, the optical adhesive layer is a pressure sensitive adhesive layer, the removing the portion of the material layer located in the first area on the display panel including: illuminating the first area from the first face of the display panel using a laser, such that the portion of the optical adhesive layer located in the first area is heated to be cracked and degraded; cutting a boundary of portions of the support film and the optical adhesive layer in the first area such that the portions of the support film and the optical adhesive layer in the first area fall from the display panel.

In an embodiment, the optical adhesive layer is an ultraviolet curing adhesive layer, the removing the portion of the material layer located in the first area on the display panel including: cutting a boundary of portions of the support film and the optical adhesive layer in the first area such that the portions of the support film and the optical adhesive layer in the first area fall from the display panel; wherein after removing the portion of the material layer located in the first area on the display panel, the method further includes: illuminating the optical adhesive layer left on the display panel using an ultraviolet light to cure the optical adhesive layer left on the display panel.

In an embodiment, the removing the portion of the material layer located in the first area on the display panel includes: removing the portions of the support film and the optical adhesive layer in the first area to form a residual support film and a residual optical adhesive layer on the display panel, wherein orthographic projections of the touch panel and the polarizer on the display panel are both located within orthographic projections of the residual support film and the residual optical adhesive layer on the display panel.

In an embodiment, the removing the portion of the material layer located in the first area on the display panel includes: removing the portions of the support film and the optical adhesive layer in the first area to form a residual support film and a residual optical adhesive layer on the display panel, wherein orthographic projections of the touch panel and the polarizer on the display panel are both located within orthographic projections of the residual support film and the residual optical adhesive layer on the display panel.

In an embodiment, the removing the portion of the material layer located in the first area on the display panel includes: removing the portions of the support film and the optical adhesive layer in the first area to form a first residual support film and a second residual support film separated from each other and a first residual optical adhesive layer and a second residual optical adhesive layer separated from each other on the display panel, wherein orthographic projections of the touch panel and the polarizer on the display panel coincide with orthographic projections of the first residual support film and the first residual optical adhesive layer on the display panel, the second residual support film and the second residual optical adhesive layer being located in the second area; and wherein the bending the first area of the display panel towards the first face of the display panel includes: bending the first area of the display panel towards the first face of the display panel such that a U-shaped structure is formed at an end of the display panel and the second residual support film contacts with the first residual support film.

In an embodiment, the removing the portion of the material layer located in the first area on the display panel includes: removing the portions of the support film and the optical adhesive layer in the first area to form a first residual support film and a second residual support film separated from each other and a first residual optical adhesive layer and a second residual optical adhesive layer separated from each other on the display panel, wherein orthographic projections of the touch panel and the polarizer on the display panel coincide with orthographic projections of the first residual support film and the first residual optical adhesive layer on the display panel, the second residual support film and the second residual optical adhesive layer being located in the second area; and wherein the bending the first area of the display panel towards the first face of the display panel includes: bending the first area of the display panel towards the first face of the display panel such that a U-shaped structure is formed at an end of the display panel and the second residual support film contacts with the first residual support film.

In an embodiment, the processing the portion of the optical adhesive layer located in the first area to reduce the viscosity of the portion includes: processing the portion of the optical adhesive layer located in the first area to reduce the viscosity of the portion by laser ablation, chemical process or physical process.

In an embodiment, the processing the portion of the optical adhesive layer located in the first area to reduce the viscosity of the portion by physical process includes: spraying non-adhesive powders towards the portion of the optical adhesive layer located in the first area.

In an embodiment, the non-adhesive powders include nano-particles.

In an embodiment, the first area has a length not greater than 2 millimeters in a direction parallel to a lengthwise direction of the display panel.

An embodiment of the present disclosure provides a display device including: a display panel having a first area located out of an effective display region of the display panel, the first area having one end connected to a second area of the display panel and the other end connected to a third area of the display panel; a material layer arranged on a first face of the display panel; a touch panel arranged on a second face of the display panel in opposite to the first face; and a polarizer arranged on a side of the touch panel away from the display panel, wherein the second area and the third area are arranged on both sides of the material layer respectively.

In an embodiment, a flexible circuit board is arranged on an outer side of the second area, the flexible circuit board having a lengthwise direction parallel to a lengthwise direction of the material layer.

In an embodiment, the material layer includes a support film and an optical adhesive layer arranged between the support film and the display panel, wherein sum of thickness of the support film and the optical adhesive layer is less than distance between the second area and the third area, and a space between the support film and the second area is filled with a residual support film and a residual optical adhesive layer stacked sequentially, the residual support film contacting with the support film.

In an embodiment, the flexible circuit board includes a chip on film.

BRIEF DESCRIPTION OF THE DRAWINGS

In order to describe technical solutions in embodiments of the present disclosure more clearly, figures that are needed to explain the embodiments will below be described briefly. Apparently, the following figures only show some of the embodiments of the present disclosure. From these figures, the skilled person in the art can derive other figures without any creative efforts.

FIG. 2-1 is a flow chart of a method for manufacturing another display device provided by an embodiment of the present disclosure;

FIG. 2-2 is a structural schematic view showing a material layer is formed in a display panel in the embodiment shown in FIG. 2-1;

FIG. 2-3 is a flow chart of forming the material layer in the embodiment shown in FIG. 2-1;

FIG. 2-4 is a structural schematic view showing an optical adhesive layer is formed in the embodiment shown in FIG. 2-1;

FIG. 2-5 is a structural schematic view showing an optical adhesive layer is processed to reduce viscosity in the embodiment shown in FIG. 2-1;

FIG. 2-6 is a structural schematic view showing a support film is adhered in the embodiment shown in FIG. 2-1;

FIG. 2-7 is a structural schematic view showing a touch panel and a polarizer are formed in the embodiment shown in FIG. 2-1;

FIG. 2-8 is a right view of the display panel shown in FIG. 2-7;

FIG. 2-9 is a structural schematic view showing a flexible circuit board is formed in the embodiment shown in FIG. 2-1;

FIG. 2-10 is a structural schematic view showing a first area is illuminated by a laser in the embodiment shown in FIG. 2-1;

FIG. 2-11 is a structural schematic view showing the optical adhesive layer is heated to be cracked and degraded in the embodiment shown in FIG. 2-10;

FIG. 2-12 is a structural schematic view showing the support film and the optical adhesive layer are cut in the embodiment shown in FIG. 2-1;

FIG. 2-13 is a structural schematic view showing the support film and the optical adhesive layer fall from the display panel in the embodiment shown in FIG. 2-1;

FIG. 2-14 is another structural schematic view showing the support film and the optical adhesive layer fall from the display panel in the embodiment shown in FIG. 2-1;

FIG. 2-15 is a structural schematic view showing the display panel shown in FIG. 2-13 is bent;

FIG. 2-16 is a structural schematic view showing the display panel shown in FIG. 2-14 is bent;

FIG. 3-1 is a flow chart of another method for manufacturing a display device provided by an embodiment of the present disclosure;

FIG. 3-2 is a structural schematic view showing the support film and the optical adhesive layer are cut in the embodiment shown in FIG. 3-1;

FIG. 3-3 is a structural schematic view showing the optical adhesive layer is illuminated by an ultraviolet light in the embodiment shown in FIG. 3-1;

FIG. 3-4 is a schematic graph showing an adhesive force of the ultraviolet curing adhesive; and FIG. 4 is a structural schematic view showing a display device provided by an embodiment of the present disclosure.

DETAILED DESCRIPTION OF PREFERRED EMBODIMENTS OF THE DISCLOSURE

Figure 1:
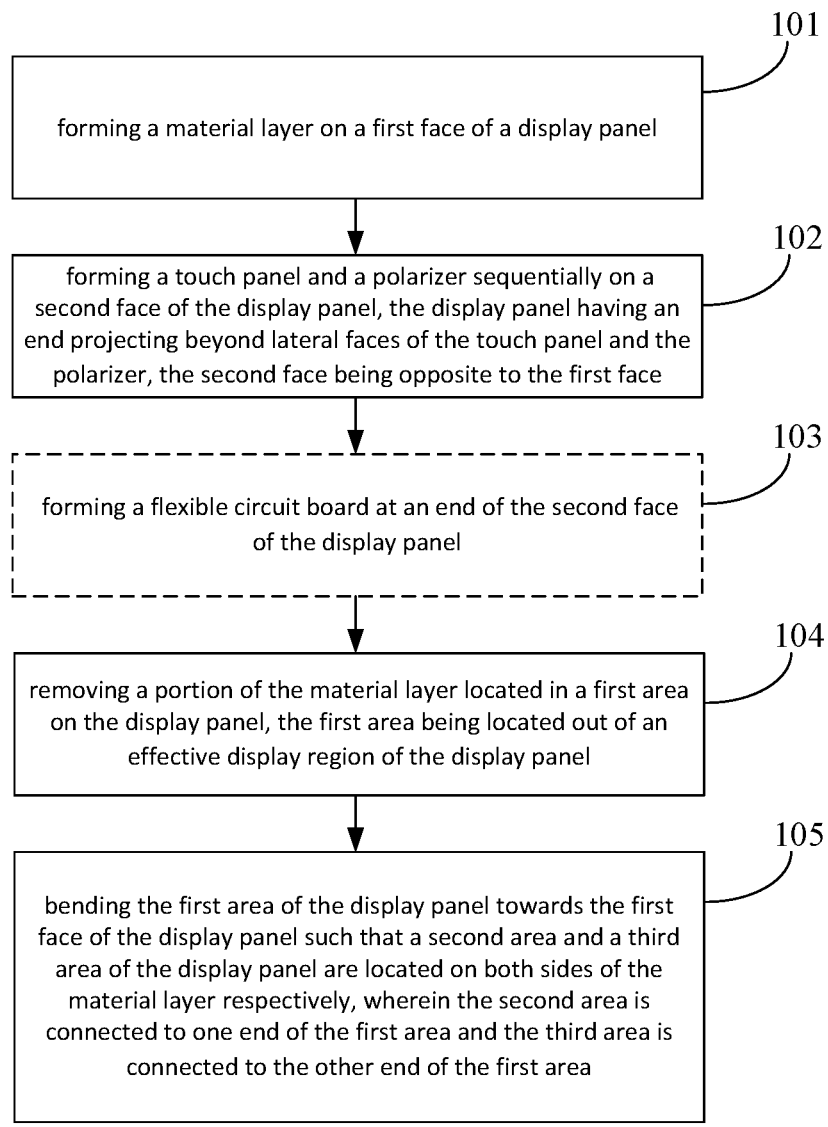
FIG. 1 is a flow chart of a method for manufacturing a display device provided by an embodiment of the present disclosure.

In order to further explain objects, technical solutions and advantages more clearly, the exemplified embodiments of the present disclosure will below be explained in detail with reference to the accompanied drawings.

In addition, in the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

The inventors have found that the related art at least has the following problems: in order to achieve a narrow border, when an end of the display panel towards the COF is bent towards the optical clear adhesive layer, total thickness of the support film and the optical clear adhesive layer is relatively large and there is stress between the PI substrate and the support film; thus, the display panel cannot be bent completely or some metal connection points on the display panel are cracked.

An embodiment of the present disclosure provides a method for manufacturing a display device. As shown in FIG. 1, the method includes:

Step 101 of forming a material layer on a first face of a display panel, as an example, the material layer and the display panel may have a same length, for example, the display panel includes a PI substrate;

Step 102 of forming a touch panel and a polarizer sequentially on a second face of the display panel, the display panel having an end projecting beyond lateral faces of the touch panel and the polarizer, the second face being opposite to the first face, for example, the second face is parallel to the first face;

Step 103 of forming a flexible circuit board at an end of the second face of the display panel;

Step 104 of removing a portion of the material layer located in a first area on the display panel, the first area being located out of an effective display region of the display panel; and Step 105 of bending the first area of the display panel towards the first face of the display panel such that a second area and a third area of the display panel are located on both sides of the material layer respectively, wherein the second area is connected to one end of the first area and the third area is connected to the other end of the first area.

The above Step 103 is an optional step.

As an example, an intersection line of lateral faces of the touch panel and the polarizer with the second face has a lengthwise direction parallel to a widthwise direction of the display panel.

In summary, in the method for manufacturing a display device provided by an embodiment of the present disclosure, material in the first area on the display panel is removed, thus, when the first area of the display panel is bent towards the first face of the display panel, it fails to be affected by stress between the PI substrate and the material in the display panel. In this way, the display panel can be bent completely, so as to achieve narrow border design.

As an example, when a flexible circuit board is formed at an end of the second face of the display panel, the first area may be arranged on a side of the display panel towards the flexible circuit board, and the second area may adjoin the flexible circuit board.

As an example, the second area of the display panel may be parallel to the third area of the display panel. However, the present disclosure is not limited to this, for example, the second area of the display panel may also be inclined at a certain angle with respect to the third area of the display panel.

As an example, the material layer may include an optical adhesive layer and a support film. Correspondingly, the Step 101 includes: forming the optical adhesive layer on the support film, for example, the support film has the same length as the display panel; processing a portion of the optical adhesive layer located in the first area to reduce viscosity of the portion; and adhering the support film to the first face of the display panel by the processed optical adhesive layer.

In an example, the optical adhesive layer is a pressure sensitive adhesive layer. Correspondingly, the Step 104 includes: illuminating the first area from the first face of the display panel using a laser, such that the portion of the optical adhesive layer located in the first area is heated to be cracked and degraded; cutting a boundary of portions of the support film and the optical adhesive layer in the first area such that the portions of the support film and the optical adhesive layer located in the first area fall from the display panel.

In another example, the optical adhesive layer is an ultraviolet curing adhesive layer. Correspondingly, the Step 104 includes: cutting a boundary of portions of the support film and the optical adhesive layer located in the first area such that the portions of the support film and the optical adhesive layer located in the first area fall from the display panel. After the Step 104, the method may further include:

illuminating the optical adhesive layer left on the display panel using an ultraviolet light to cure the optical adhesive layer left on the display panel.

As an example, the Step 104 may include: removing the portions of the support film and the optical adhesive layer located in the first area to form a residual support film and a residual optical adhesive layer on the display panel. Orthographic projections of the touch panel and the polarizer on the display panel are both located within orthographic projections of the residual support film and the residual optical adhesive layer on the display panel.

As an example, the Step 104 may include: removing the portions of the support film and the optical adhesive layer located in the first area to form a first residual support film and a second residual support film separated from each other as well as a first residual optical adhesive layer and a second residual optical adhesive layer separated from each other on the display panel. Orthographic projections of the touch panel and the polarizer on the display panel coincide with orthographic projections of the first residual support film and the first residual optical adhesive layer on the display panel. The second residual support film and the second residual optical adhesive layer are located in the second area. The Step 105 includes: bending the first area of the display panel towards the first face of the display panel such that a U-shaped structure is formed at an end of the display panel and the second residual support film contacts with the first residual support film.

Figures 1, 2:
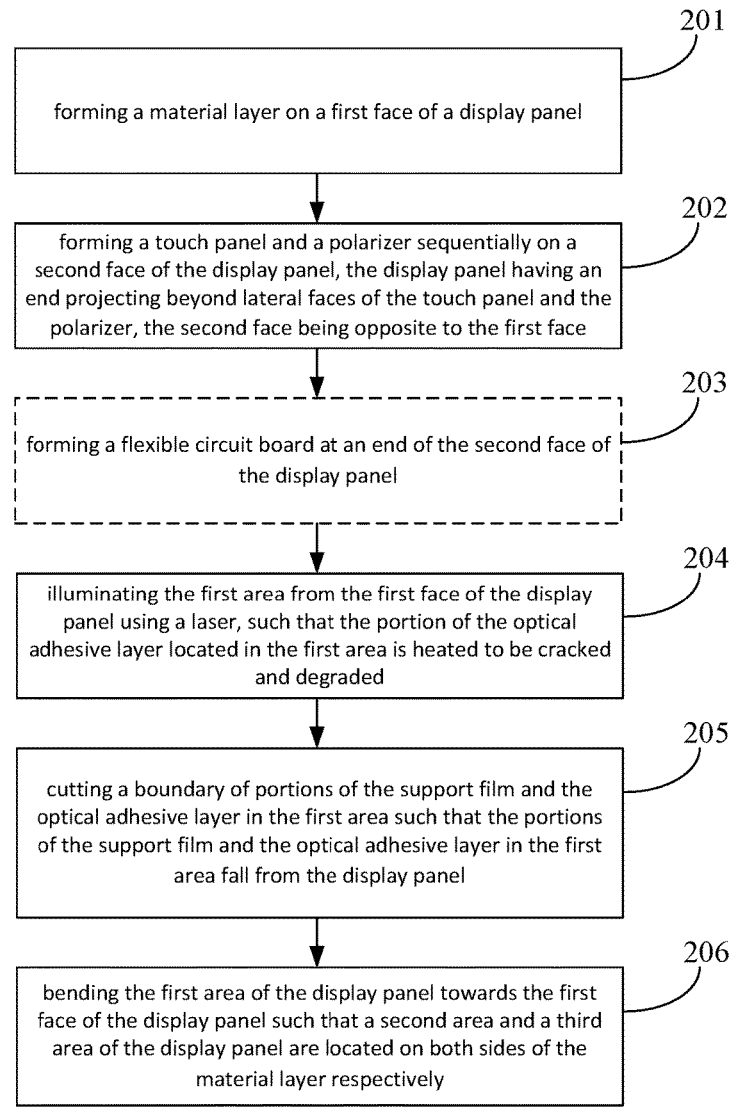
Figure 2:
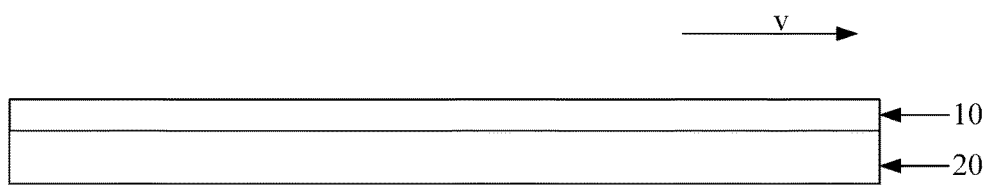

An embodiment of the present disclosure also provides another method for manufacturing a display device. As shown in FIG. 2-1, the method may include Step 201 to Step 206.

Step 201: forming a material layer on a first face of a display panel, as an example, the material layer and the display panel may have a same length.

As shown in FIG. 2-2, a material layer 20 which has the same length as the display panel 10 is formed on the first face of the display panel 10. The display panel 10 includes a PI substrate.

Figures 2, 3:
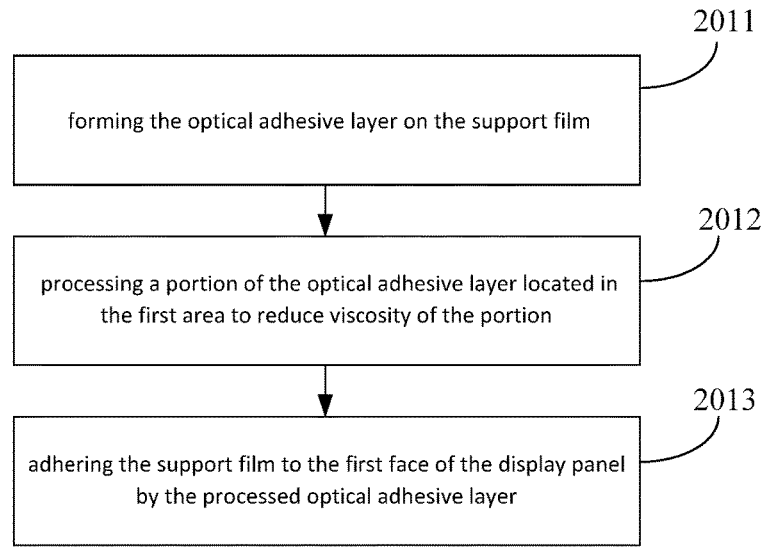

As an example, the material layer includes an optical adhesive layer and a support film. Correspondingly, as shown in FIG. 2-3, the Step 201 may include: Step 2011 to Step 2013.

Step 2011: forming the optical adhesive layer on the support film, for example, the support film has the same length as the display panel.

Figures 2, 3, 4:
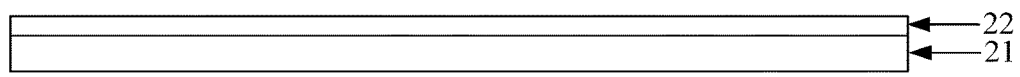
Figures 2, 3, 4, 5:
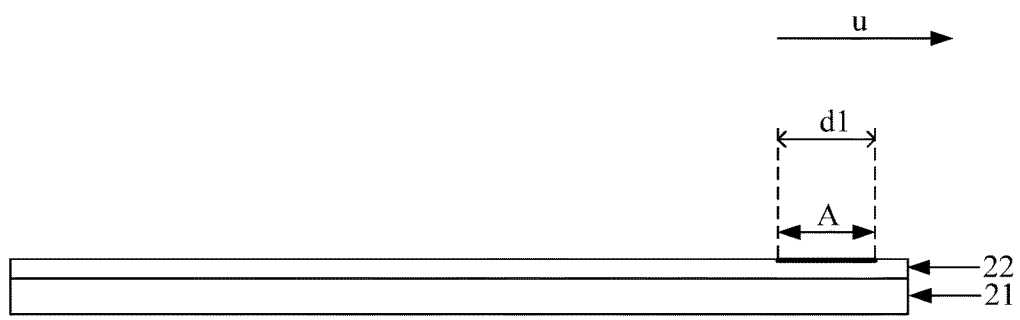
Figures 2, 3, 4, 5, 6:
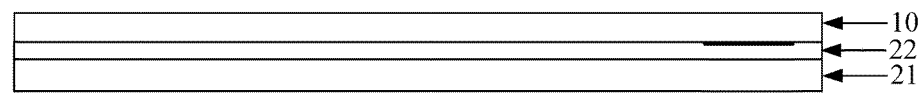
Figures 2, 3, 4, 5, 6, 7:
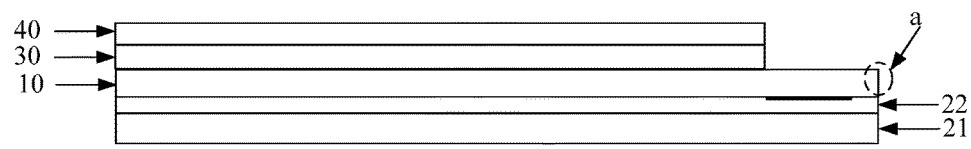
Figures 2, 3, 4, 5, 6, 7, 8:
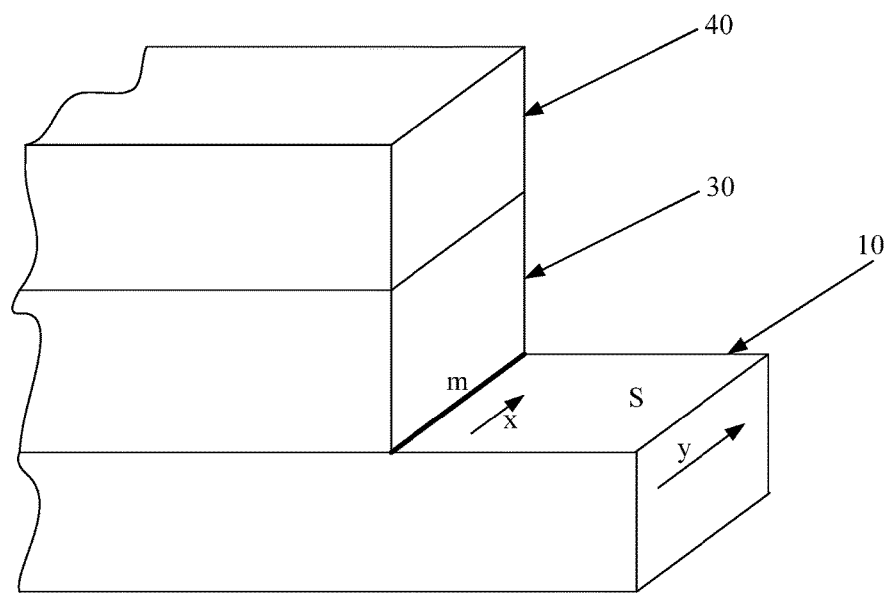
Figures 2, 3, 4, 5, 6, 7, 8, 9:
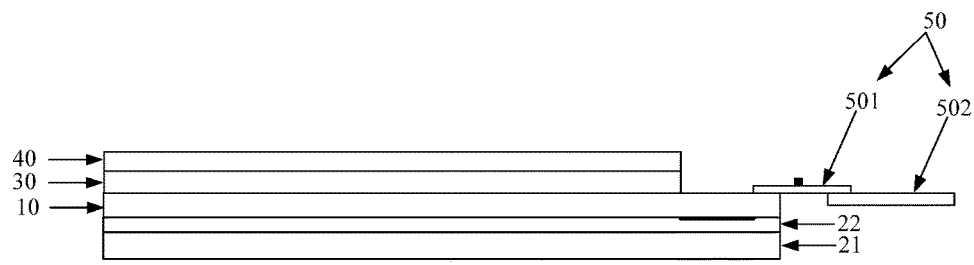
Figures 2, 3, 4, 5, 6, 7, 8, 9, 10:
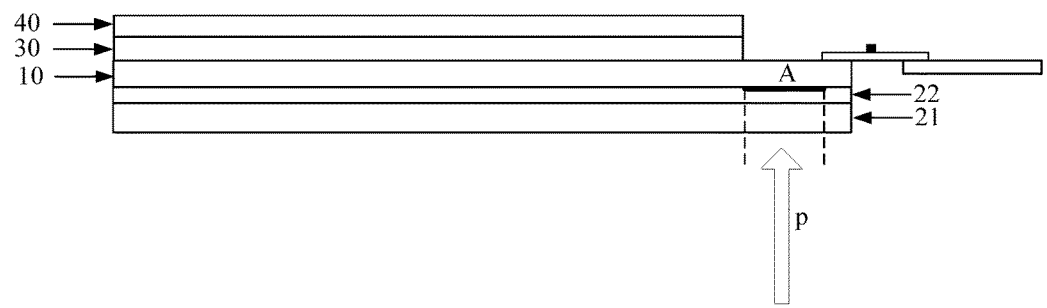
Figures 2, 3, 4, 5, 6, 7, 8, 9, 10, 11:
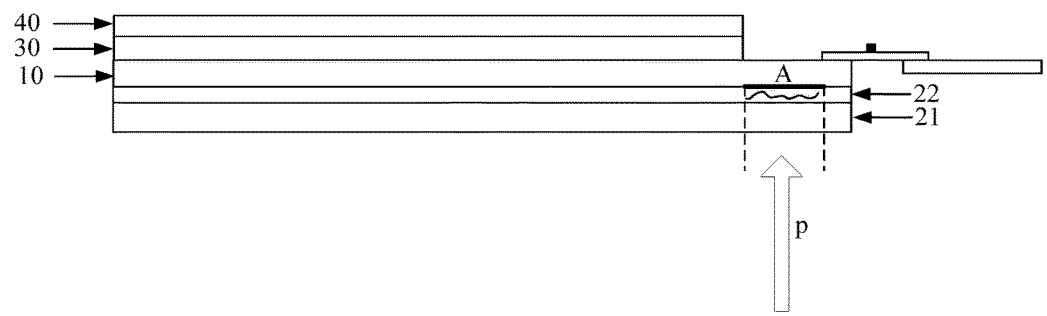
Figures 2, 3, 4, 5, 6, 7, 8, 9, 10, 11, 12:
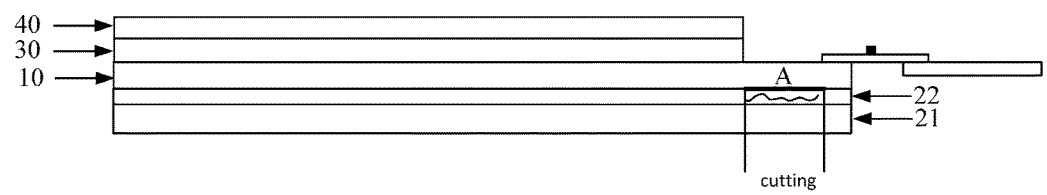
Figures 2, 3, 4, 5, 6, 7, 8, 9, 10, 11, 12, 13:
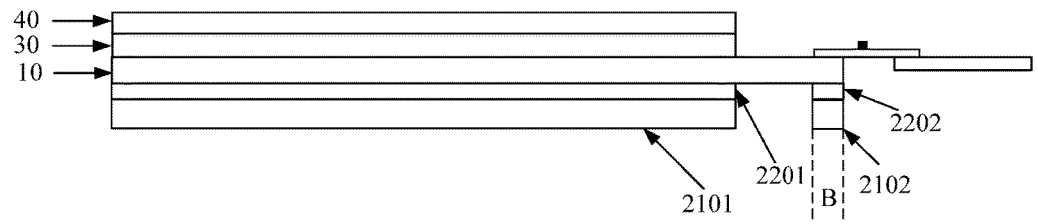
Figures 2, 3, 4, 5, 6, 7, 8, 9, 10, 11, 12, 13, 14:
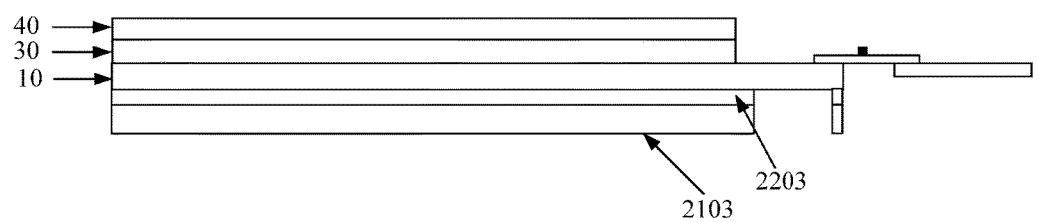
Figures 2, 3, 4, 5, 6, 7, 8, 9, 10, 11, 12, 13, 14, 15:
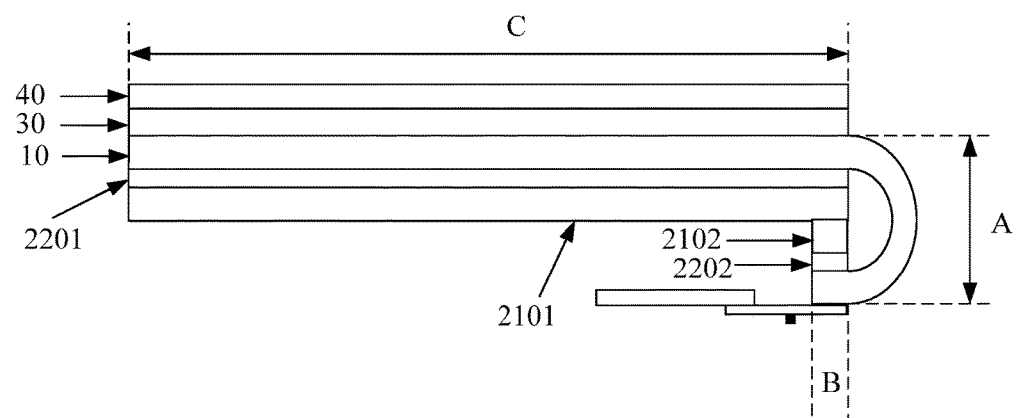
Figures 2, 3, 4, 5, 6, 7, 8, 9, 10, 11, 12, 13, 14, 15, 16:
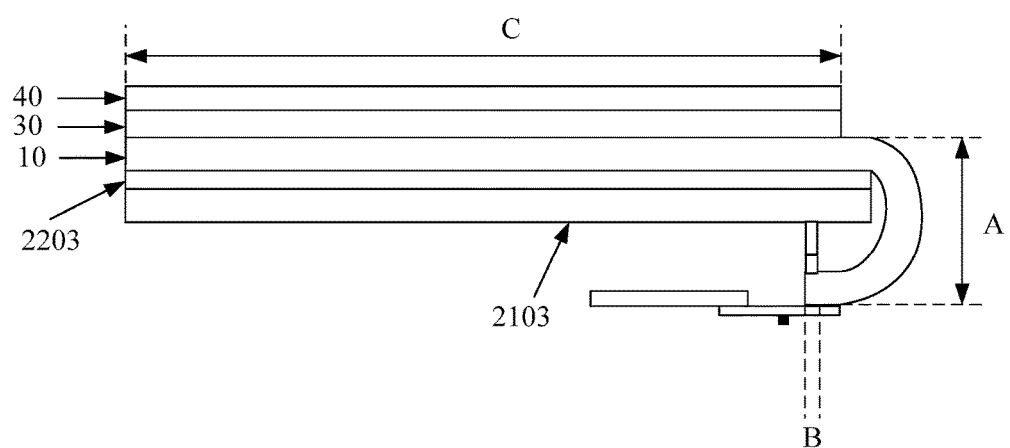
Figures 1, 3:
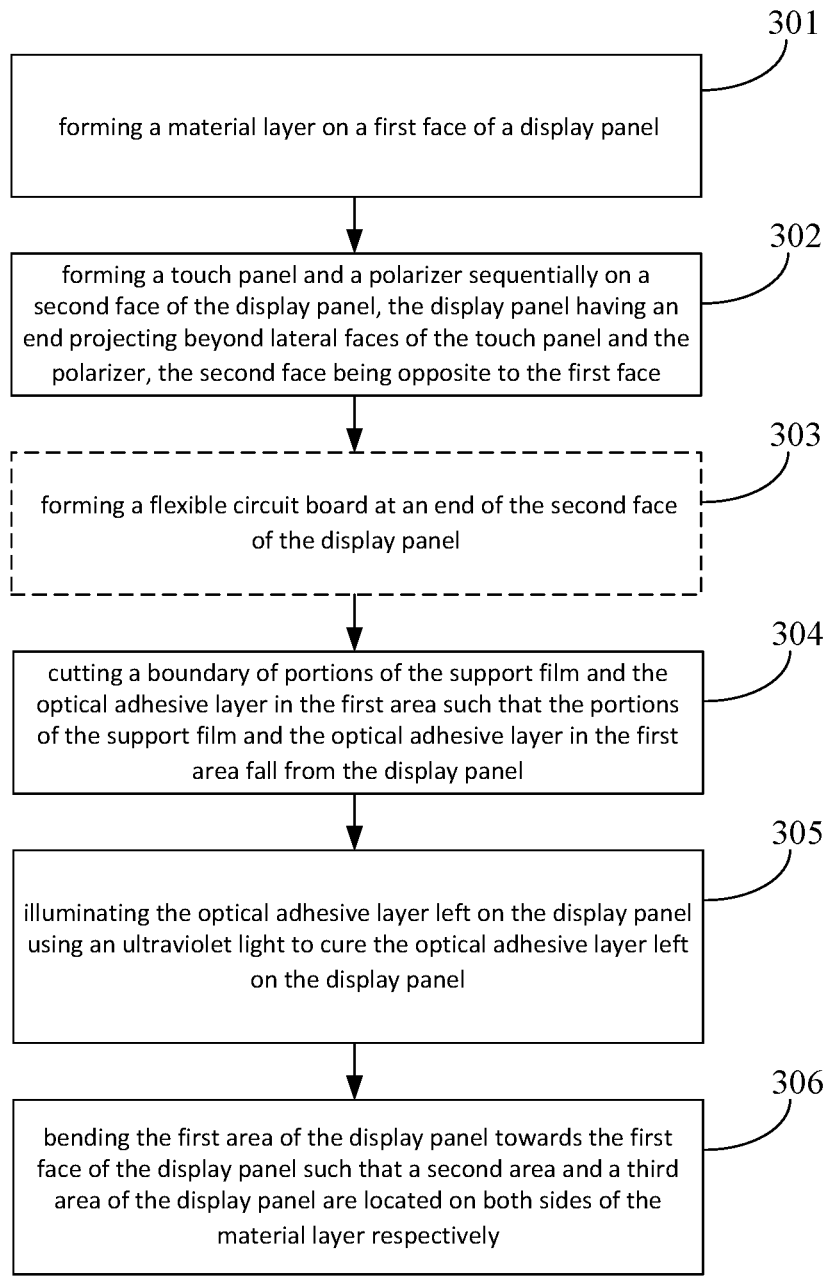
Figures 2, 3:
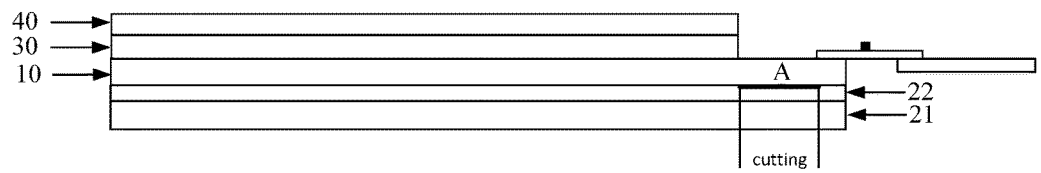
Figure 3:
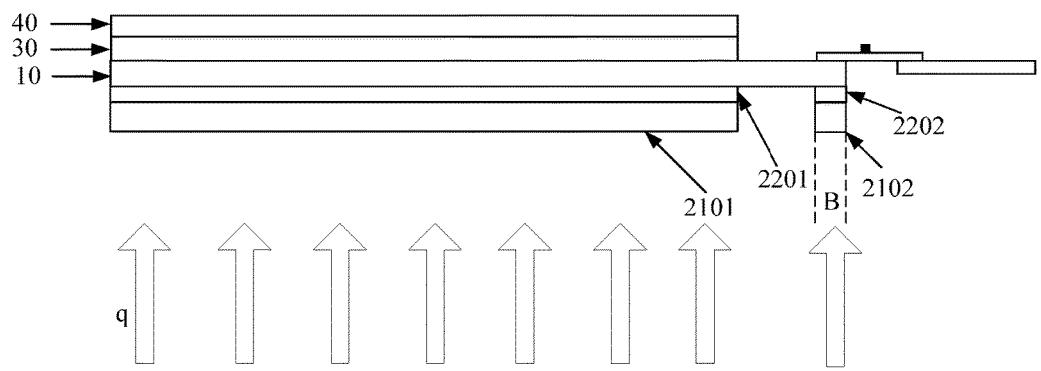
Figures 3, 4:
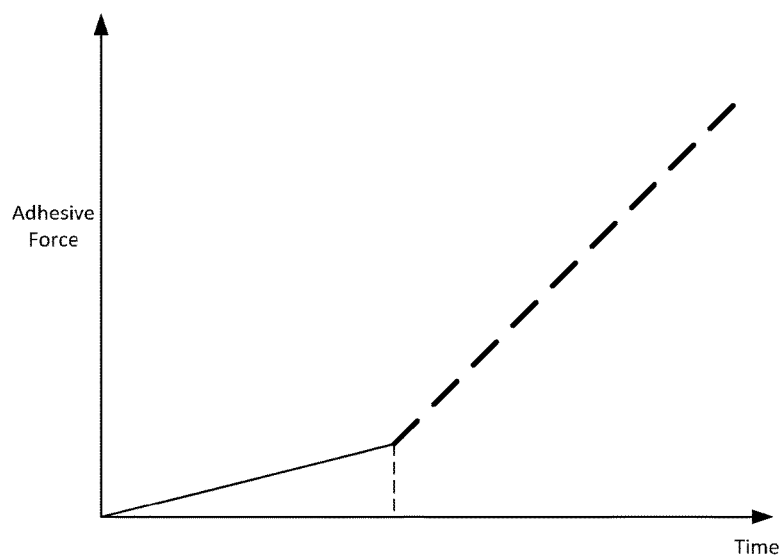
Figure 4:
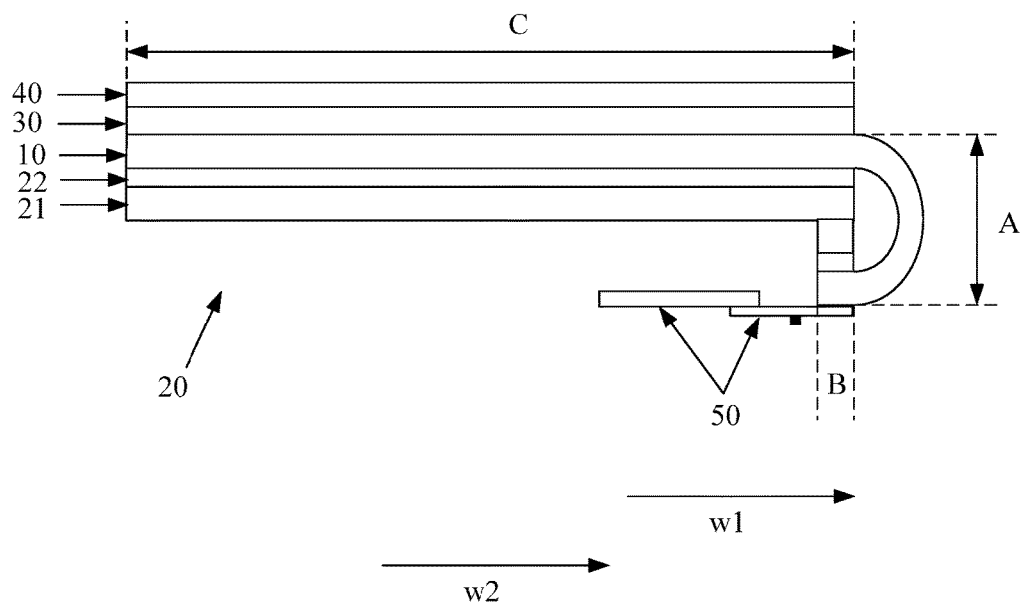

As shown in FIG. 2-4, the optical adhesive layer 22 is formed on the support film 21 which has the same length as the display panel ('10' in FIG. 2-2). In an example, the optical adhesive layer may be a pressure sensitive layer. When the optical adhesive layer is formed on the support film, the pressure sensitive layer may be adhered to the support film by pressing it by a roller.

Step 2012: processing a portion of the optical adhesive layer located in the first area to reduce viscosity of the portion.

As shown in FIG. 2-5, a portion of the optical adhesive layer located in the first area A is processed to reduce viscosity of the portion.

As an example, the first area A has a length dl not greater than 2 millimeters. The lengthwise direction (the direction indicated by 'u' in FIG. 2-5) of the first area A is parallel to the lengthwise direction (the direction indicated by 'v' in FIG. 2-2) of the display panel ('10' in FIG. 2-2). The first area A is located out of an effective display region of the display panel and close to the flexible circuit board ('50' in FIG. 2-9).

As an example, the Step 2012 may include:

processing the portion of the optical adhesive layer located in the first area to reduce viscosity of the portion by laser ablation, chemical process or physical process.

The pressure sensitive adhesive layer is taken as an example. The pressure sensitive adhesive layer has characteristic of thermal separation at high temperature. When the temperature reaches a special high temperature (such as above 200° C., the temperature may be achieved by applying such as treatment agents or modifying groups thereof to the pressure sensitive adhesive layer), the pressure sensitive adhesive layer may be cracked and degraded. In this way, viscosity of the pressure sensitive adhesive layer may drop rapidly.

In an example, when the portion of the optical adhesive layer located in the first area is processed to reduce viscosity of the portion by chemical process, a certain chemical solvent which may react with the optical adhesive layer may be sprayed or coated to the first area.

As an example, processing the portion of the optical adhesive layer located in the first area to reduce viscosity of the portion by physical process may include:

spraying non-adhesive powders towards the portion of the optical adhesive layer located in the first area.

As an example, the non-adhesive powders may include nano-particles. The nano-particles may include nanometer silicon beads.

It should be noted that when the portion of the optical adhesive layer located in the first area is processed to reduce viscosity, the processed optical adhesive layer needs to have relatively small thickness so as to avoid air bubbles produced between the optical adhesive layer and the support film or other adverse phenomenon.

Step 2013: adhering the support film to the first face of the display panel by the processed optical adhesive layer.

As shown in FIG. 2-6, the support film 21 is adhered by the processed optical adhesive layer 22 to the first face of the display panel 10.

In the embodiment of the present disclosure, the portion of the optical adhesive layer located in the first area is processed in advance to reduce viscosity thereof, thus, the portions of the support film and the optical adhesive layer located in the first area on the display panel can be removed rapidly in subsequent steps to improve work efficiency.

Step 202: forming a touch panel and a polarizer sequentially on a second face of the display panel, the display panel having an end projecting beyond lateral faces of the touch panel and the polarizer, the second face being opposite to the first face, for example, the second face is parallel to the first face.

As shown in FIG. 2-7, a touch panel 30 and a polarizer 40 are formed sequentially on a second face of the display panel 10, and the display panel 10 has an end a projecting beyond lateral faces of the touch panel 30 and the polarizer 40. The lateral face of the touch panel 30 and the lateral face of the polarizer 40 may be located in a same plane. However, the embodiments of the present disclosure are not limited to this, for example, the lateral face of the touch panel 30 and the lateral face of the polarizer 40 may not be located in the same plane. In particular, as shown in FIG. 2-8, an intersection line m of lateral faces of the touch panel 30 and the polarizer 40 with the second face S of the display panel 10 has a lengthwise direction (the direction indicated by 'x' in FIG. 2-8) parallel to a widthwise direction (the direction indicated by 'y' in FIG. 2-8) of the display panel. FIG. 2-8 is a perspective view of the end of the display panel shown in FIG. 2-7. Regarding significations of other reference numerals in FIG. 2-7, it may refer to FIG. 2-6.

Step 203: forming a flexible circuit board at an end of the second face of the display panel. The Step 203 is optional.

As shown in FIG. 2-9, a flexible circuit board 50 is formed at an end of the second face of the display panel 10. Regarding significations of other reference numerals in FIG. 2-9, it may refer to FIG. 2-7.

As an example, the flexible circuit board 50 includes a COF 501. A FPC 502 is also formed at the end of the COF away from the display panel. The COF functions to carry chips, connect circuits and provide support and insulation. The COF has characteristics such as high wiring density, low weight, low thickness and flexibility. The FPC is regarded as a substrate for connecting electronic elements and a medium for transmitting electronic product signals. The FPC has characteristics such as low weight, low thickness, small length, small volume and flexibility. The FPC also has a relatively high heat resistance and can meet the requirements for high density interconnection and high stability among elements, such that the signal output quality can be enhanced significantly. Regarding the COF and FPC, it may refer to the related art. The details will be omitted herein.

Step 204: illuminating the first area from the first face of the display panel using a laser, such that the portion of the optical adhesive layer located in the first area is heated to be cracked and degraded.

The laser has large local energy and high temperature. However, the first area is located out of the effective display region of the display panel and has a temperature below temperature tolerance of the PI substrate, thus, use of the laser to illuminate the first area cannot cause damage to display elements.

As shown in FIG. 2-10, the first area A may be illuminated from the first face of the display panel 10 using a laser p, such that the portion of the optical adhesive layer 22 located in the first area A is heated to be cracked and degraded to reduce its viscosity, as illustrated in FIG. 2-11. In FIG. 2-10 and FIG. 2-11, the touch panel is indicated by '30'; the polarizer is indicated by '40' and the support film is indicated by '21'.

Step 205: cutting a boundary of portions of the support film and the optical adhesive layer in the first area such that the portions of the support film and the optical adhesive layer in the first area fall from the display panel.

As shown in FIG. 2-12, a boundary of portions of the support film 21 and the optical adhesive layer 22 in the first area A is cut such that the portions of the support film 21 and the optical adhesive layer 22 in the first area A fall from the display panel 10, as illustrated in FIG. 2-13. In an example, as shown in FIG. 2-13, the portions of the support film 21 and the optical adhesive layer 22 in the first area A may be removed to form a first residual support film 2101 and a second residual support film 2102 separated from each other as well as a first residual optical adhesive layer 2201 and a second residual optical adhesive layer 2202 separated from each other on the display panel 10. Orthographic projections of the touch panel 30 and the polarizer 40 on the display panel 10 coincide with orthographic projections of the first residual support film 2101 and the first residual optical adhesive layer 2201 on the display panel 10. The second residual support film 2102 and the second residual optical adhesive layer 2202 are located in the second area B.

As an example, as shown in FIG. 2-14, the portions of the support film and the optical adhesive layer in the first area may also be removed to form a residual support film 2103 and a residual optical adhesive layer 2203 on the display panel 10. Orthographic projections of the touch panel 30 and the polarizer 40 on the display panel 10 are both located within orthographic projections of the residual support film 2103 and the residual optical adhesive layer 2203 on the display panel. As an example, the portions of the support film and the optical adhesive layer located in the second area may be removed, or not be removed. FIG. 2-14 shows a schematic view in which the portions of the support film and the optical adhesive layer located in the second area are not removed.

Step 206: bending the first area of the display panel towards the first face of the display panel such that a second area and a third area of the display panel are located on both sides of the material layer respectively, for example, the second area and the third area may be parallel to each other.

As an example, the third area is located above the material layer. The second area is connected to one end of the first area and close to the flexible circuit board, while the third area is connected to the other end of the first area.

In particular, a panel part in the first area on the display panel is bent towards the first face of the display panel such that the panel part in the second area on the display panel is parallel to the panel part in the third area on the display panel. The panel part in the third area may be located above the material layer. The panel part in the second area is connected to one end of the panel part in the first area and close to the flexible circuit board while the panel part in the third area is connected to the other end of the panel part in the first area.

With reference to the example shown in FIG. 2-13, as shown in FIG. 2-15, the first area A of the display panel 10 is bent towards the first face of the display panel 10 such that the second area B of the display panel 10 is parallel to the third area C of the display panel 10. A U-shaped structure is formed at an end of the display panel 10 and the second residual support film 2102 contacts with the first residual support film 2101. As shown in FIG. 2-15, the third area C is located above the first residual support film 2101 and the first residual optical adhesive layer 2201, that is, it is located on the side away from the material layer. The second area B is connected to one end of the first area A and close to the flexible circuit board and the third area C is connected to the other end of the first area A. As a space between the first residual support film 2101 and the second area B is filled with the second residual support film 2102 and the second residual optical adhesive layer 2202, the display panel has better stability.

Alternatively, with reference to the example shown in FIG. 2-14, as shown in FIG. 2-16, the first area A of the display panel 10 is bent towards the first face of the display panel 10 such that the second area B of the display panel 10 is parallel to the third area C of the display panel 10. The third area C is located above the residual support film 2103 and the residual optical adhesive layer 2203. The second area B is connected to one end of the first area A and close to the flexible circuit board and the third area C is connected to the other end of the first area A. In the embodiment of the present disclosure, the first area is located out of the effective display area of the display panel. In embodiments of the present disclosure, sizes of the first area, the second area and the third area are not limited.

As discussed above, in the method for manufacturing a display device provided by an embodiment of the present disclosure, material in the first area on the display panel is removed, thus, when the first area of the display panel is bent towards the first face of the display panel, it fails to be affected by stress between the PI substrate and the material in the display panel. In this way, the display panel can be bent completely, so as to achieve narrow border design.

An embodiment of the present disclosure also provides a further method for manufacturing a display device. As shown in FIG. 3-1, the method may include Step 301 to Step 306.

Step 301: forming a material layer on a first face of a display panel, as an example, the material layer and the display panel may have a same length.

In an example, the material layer includes an optical adhesive layer and a support film. Regarding the details of the Step 301, it may refer to the Step 201.

As an example, the optical adhesive layer in the embodiment of the present disclosure is an ultraviolet curing adhesive layer.

As an example, the ultraviolet curing adhesive layer may be adhered to the support film by pressing it by a roller.

Step 302: forming a touch panel and a polarizer sequentially on a second face of the display panel, the display panel having an end projecting beyond lateral faces of the touch panel and the polarizer, the second face being opposite to the first face.

As an example, an intersection line of lateral faces of the touch panel and the polarizer with the second face has a lengthwise direction parallel to a widthwise direction of the display panel.

Regarding the details of the Step 302, it may refer to the Step 202.

Step 303: forming a flexible circuit board at an end of the second face of the display panel.

Regarding the details of the Step 303, it may refer to the Step 203.

Step 304: cutting a boundary of portions of the support film and the optical adhesive layer in the first area such that the portions of the support film and the optical adhesive layer in the first area fall from the display panel.

As shown in FIG. 3-2, a boundary of portions of the support film 21 and the optical adhesive layer 22 in the first area A is cut such that the portions of the support film 21 and the optical adhesive layer 22 in the first area A fall from the display panel 10, as illustrated in FIG. 2-13. In FIG. 3-2, the touch panel is indicated by '30' and the polarizer is indicated by '40'.

As such, when the material in the first area on the display panel, as shown in FIG. 2-13, the portions of the support film and the optical adhesive layer in the first area may be removed to form a first residual support film 2101 and a second residual support film 2102 separated from each other and a first residual optical adhesive layer 2201 and a second residual optical adhesive layer 2202 separated from each other on the display panel 10. Orthographic projections of the touch panel 30 and the polarizer 40 on the display panel 10 coincide with orthographic projections of the first residual support film 2101 and the first residual optical adhesive layer 2201 on the display panel 10. The second residual support film 2102 and the second residual optical adhesive layer 2202 are located in the second area B.

As an example, as shown in FIG. 2-14, the portions of the support film and the optical adhesive layer in the first area may also be removed to form a residual support film 2103 and a residual optical adhesive layer 2203 on the display panel 10. Orthographic projections of the touch panel 30 and the polarizer 40 on the display panel 10 are both located within orthographic projections of the residual support film 2103 and the residual optical adhesive layer 2203 on the display panel. As an example, the portions of the support film and the optical adhesive layer located in the second area may be removed, or not be removed.

Step 305: illuminating the optical adhesive layer left on the display panel using an ultraviolet light to cure the optical adhesive layer left on the display panel.

With reference to the example shown in FIG. 2-13, as illustrated in FIG. 3-3, the first residual optical adhesive layer 2201 and the second residual optical adhesive layer 2202 left on the display panel 10 are illuminated using an ultraviolet light q to cure the first residual optical adhesive layer 2201 and the second residual optical adhesive layer 2202 left on the display panel 10. In FIG. 3-3, the touch panel is indicated by '30'; the polarizer is indicated by '40'; the first residual support film is indicated by '2101'; and the second residual support film is indicated by '2102'.

The ultraviolet curing adhesive may be adhered to the support film by pressing it by a roller. The ultraviolet curing adhesive has a relatively small adhesive force, even it may be stripped mechanically. Thus, in the embodiment of the present disclosure, use of the ultraviolet light to illuminate the optical adhesive layer left on the display panel may cure the optical adhesive layer and enhance the adhesive force of the ultraviolet curing adhesive. FIG. 3-4 is a graph schematically showing the adhesive force of the ultraviolet curing adhesive. In FIG. 3-4, time is indicated in horizontal ordinate and the adhesive force is indicated in vertical ordinate. The solid line represents variation of the adhesive force of the ultraviolet curing adhesive when the ultraviolet curing adhesive is adhered to the support film by pressing it by the roller. The thick dashed line represents variation of the adhesive force of the ultraviolet curing adhesive when the ultraviolet light illuminates the optical adhesive layer left on the display panel. From FIG. 3-4, it can be seen that use of the ultraviolet light to illuminate the optical adhesive layer may enhance the adhesive force of the ultraviolet curing adhesive.

Step 306: bending the first area of the display panel towards the first face of the display panel such that a second area and a third area of the display panel are located on both sides of the material layer respectively, for example, the second area and the third area may be parallel to each other.

The third area may be located above the material layer. The second area is connected to one end of the first area and close to the flexible circuit board. The third area is connected to the other end of the first area.

Regarding the details of the Step 306 and the corresponding structural schematic view, it may refer to the Step 206.

As discussed above, in the method for manufacturing a display device provided by an embodiment of the present disclosure, the portion of the material layer in the first area on the display panel is removed, thus, when the first area of the display panel is bent towards the first face of the display panel, it fails to be affected by stress between the PI substrate and the material layer in the display panel. In this way, the display panel can be bent completely, so as to achieve narrow border design.

The method for manufacturing the display device provided by the embodiments of the present disclosure may be applied for flexible OLED display devices such as AMOLED, passive matrix OLED (abbreviated as PMOLED) and can achieve narrow border design of the flexible display device.

It should be noted that the sequence of steps of the method for manufacturing the display device provided by the embodiments of the present disclosure may be adjusted suitably and the steps may also be increased or reduced correspondingly as required. Any methods that can be envisaged easily by the skilled person in the art within the scope of the present disclosure should fall within the scope of the present disclosure. The details thereof will thus be omitted herein.

An embodiment of the present disclosure provides a display device. As shown in FIG. 4, the display device may include: a display panel 10, a material layer 20, a touch panel 30 and a polarizer 40. The display panel 10 has a first area A located out of an effective display region of the display panel 10. The first area A has one end connected to a second area B of the display panel 10 and the other end connected to the third area C of the display panel 10. The second area B and the third area C are arranged on both sides of the material layer 20 respectively. For example, the second area B and the third area C are parallel to each other. The third area C may be located above the material layer 20. A flexible circuit board 50 is arranged on an outer side of the second area B. The flexible circuit board 50 has a lengthwise direction (the direction indicated by w in FIG. 4) parallel to a lengthwise direction (the direction indicated by w2 in FIG. 4) of the material layer 20.

As shown in FIG. 4, the material layer 20 is arranged on a first face of the display panel 10. The touch panel 30 is arranged on a second face of the display panel 10 in opposite to the first face. The polarizer 40 is arranged on a side of the touch panel 30 away from the display panel 10.

As an example, as shown in FIG. 2-15, the material layer includes a support film (i.e., the first residual support film 2101) and an optical adhesive layer (i.e., the first optical adhesive layer 2201). The optical adhesive layer is arranged on the support film. The display panel 10 is arranged on the support film provided with the optical adhesive layer. The total thickness of the support film and the optical adhesive layer is less than the distance between the second area B and the third area C. The space between the support film and the second area B is filled with a residual support film (i.e., the second residual support film 2102) and a residual optical adhesive layer (i.e., the second optical adhesive layer 2202) stacked sequentially. The residual support film contacts with the support film.

As an example, the display device may also be shown in FIG. 2-16. In addition, the support film and the optical adhesive layer located in the second area in FIG. 2-16 may also be removed.

As an example, the optical adhesive layer may be a pressure sensitive adhesive layer or an ultraviolet curing adhesive layer.

As an example, the flexible circuit board includes a COF. A FPC may also be formed at the end of the COF away from the display panel.

As discussed above, in the display device provided by the embodiment of the present disclosure, the first area of the display panel of the display device has one end connected to the second area of the display panel and the other end connected to the third area of the display panel. The first area is located out of the effective display region of the display panel. The second area and the third area are located on both sides of the material layer respectively, in particular, the second area and the third area may be parallel to each other. In comparison with the display device in the related art, the display device has a simple structure in the embodiments of the present disclosure and can achieve narrow border design.

As an example, the display panel, the optical adhesive layer and the support film may be parallel to each other. For example, the display panel, the optical adhesive layer and the support film may have the same length; the polarizer and the touch panel may have the same length; and the length of the display panel may be greater than the length of the touch panel.

The skilled person in the art should understand that all or part of steps for achieving the above embodiments may be implemented in hardware, or by instructing the related hardware by programs. The programs may be stored in a computer readable record medium. The record medium described above may include such as read-only memory, hard disk or optical disc.

Only some exemplified embodiments of the present disclosure are explained in the above description. However, the scope of the present disclosure is not limited to those. Any modifications, equivalents or variants made within the spirit and principles of the present disclosure should fall within the scope of the present disclosure.

What is claimed is:

1. A method for manufacturing a display device, the method comprising:
    forming a material layer on a first face of a display panel;
    forming a touch panel and a polarizer sequentially on a second face of the display panel, the display panel having an end projecting beyond lateral faces of the touch panel and the polarizer, the second face being opposite to the first face;
    removing a portion of the material layer located in a first area on the display panel, the first area being located out of an effective display region of the display panel; and
    bending the first area of the display panel towards the first face of the display panel such that a second area and a third area of the display panel are located on opposite sides of the material layer respectively,
    wherein the second area is connected to a first end of the first area and the third area is connected to a second end of the first area.

2. The method according to claim 1, wherein the material layer and the display panel have a same length.

3. The method according to claim 1, wherein a flexible circuit board is formed at an end of the second face of the display panel and the first area is arranged at a side of the display panel towards the flexible circuit board, the second area adjoining the flexible circuit board.

4. The method according to claim 1, wherein the second area of the display panel is parallel to the third area of the display panel.

5. The method according to claim 1, wherein the material layer comprises an optical adhesive layer and a support film, the forming the material layer on the first face of the display panel comprising:
    forming the optical adhesive layer on the support film;
    processing a portion of the optical adhesive layer located in the first area to reduce viscosity of the portion; and
    adhering the support film to the first face of the display panel by the processed optical adhesive layer.

6. The method according to claim 5, wherein the support film and the display panel have a same length.

7. The method according to claim 5, wherein the optical adhesive layer is a pressure sensitive adhesive layer, the removing the portion of the material layer located in the first area on the display panel comprising:
    illuminating the first area from the first face of the display panel using a laser, such that the portion of the optical adhesive layer located in the first area is heated to be cracked and degraded; and
    cutting a boundary of portions of the support film and the optical adhesive layer in the first area such that the portions of the support film and the optical adhesive layer in the first area fall from the display panel.

8. The method according to claim 5, wherein the optical adhesive layer is an ultraviolet curing adhesive layer, the removing the portion of the material layer located in the first area on the display panel comprising:
    cutting a boundary of portions of the support film and the optical adhesive layer in the first area such that the portions of the support film and the optical adhesive layer in the first area fall from the display panel;
    wherein after removing the portion of the material layer located in the first area on the display panel, the method further comprises:
        illuminating the optical adhesive layer left on the display panel using an ultraviolet light to cure the optical adhesive layer left on the display panel.

9. The method according to claim 7, wherein the removing the portion of the material layer located in the first area on the display panel comprises:
    removing the portions of the support film and the optical adhesive layer in the first area to form a residual support film and a residual optical adhesive layer on the display panel, wherein orthographic projections of the touch panel and the polarizer on the display panel are both located within orthographic projections of the residual support film and the residual optical adhesive layer on the display panel.

10. The method according to claim 8, wherein the removing the portion of the material layer located in the first area on the display panel comprises:
removing the portions of the support film and the optical adhesive layer in the first area to form a residual support film and a residual optical adhesive layer on the display panel, wherein orthographic projections of the touch panel and the polarizer on the display panel are both located within orthographic projections of the residual support film and the residual optical adhesive layer on the display panel.

11. The method according to claim 7, wherein the removing the portion of the material layer located in the first area on the display panel comprises:
removing the portions of the support film and the optical adhesive layer in the first area to form a first residual support film and a second residual support film separated from each other and a first residual optical adhesive layer and a second residual optical adhesive layer separated from each other on the display panel, wherein orthographic projections of the touch panel and the polarizer on the display panel coincide with orthographic projections of the first residual support film and the first residual optical adhesive layer on the display panel, the second residual support film and the second residual optical adhesive layer being located in the second area; and
wherein the bending the first area of the display panel towards the first face of the display panel comprises:
bending the first area of the display panel towards the first face of the display panel such that a U-shaped structure is formed at an end of the display panel and the second residual support film contacts with the first residual support film.

12. The method according to claim 8, wherein the removing the portion of the material layer located in the first area on the display panel comprises:
removing the portions of the support film and the optical adhesive layer in the first area to form a first residual support film and a second residual support film separated from each other and a first residual optical adhesive layer and a second residual optical adhesive layer separated from each other on the display panel, wherein orthographic projections of the touch panel and the polarizer on the display panel coincide with orthographic projections of the first residual support film and the first residual optical adhesive layer on the display panel, the second residual support film and the second residual optical adhesive layer being located in the second area; and
wherein the bending the first area of the display panel towards the first face of the display panel comprises:
bending the first area of the display panel towards the first face of the display panel such that a U-shaped structure is formed at an end of the display panel and the second residual support film contacts with the first residual support film.

13. The method according to claim 5, wherein the processing the portion of the optical adhesive layer located in the first area to reduce the viscosity of the portion comprises:
processing the portion of the optical adhesive layer located in the first area to reduce the viscosity of the portion by laser ablation, chemical process or physical process.

14. The method according to claim 13, wherein the processing the portion of the optical adhesive layer located in the first area to reduce the viscosity of the portion by physical process comprises:
spraying non-adhesive powders towards the portion of the optical adhesive layer located in the first area.

15. The method according to claim 14, wherein the non-adhesive powders comprise nano-particles.

16. The method according to claim 1, wherein the first area has a length not greater than 2 millimeters in a direction parallel to a lengthwise direction of the display panel.

17. A display device comprising: a display panel having a first area located out of an effective display region of the display panel, the first area having a first end connected to a second area of the display panel and a second end connected to a third area of the display panel; a material layer arranged on a first face of the display panel; a touch panel arranged on a second face of the display panel opposite to the first face; and a polarizer arranged on a side of the touch panel away from the display panel, wherein the second area and the third area are arranged on opposite sides of the material layer respectively, wherein the material layer comprises a support film and an optical adhesive layer arranged between the support film and the display panel, wherein a sum of a thickness of the support film and the optical adhesive layer is less than a distance between the second area and the third area, and a space between the support film and the second area is filled with a residual support film and a residual optical adhesive layer stacked sequentially, the residual support film contacting with the support film.

18. The display device according to claim 17, wherein a flexible circuit board is arranged on an outer side of the second area, the flexible circuit board having a lengthwise direction parallel to a lengthwise direction of the material layer.

19. The display device according to claim 17, wherein the flexible circuit board comprises a chip on film.

* * * * *

UNITED STATES PATENT AND TRADEMARK OFFICE
CERTIFICATE OF CORRECTION

PATENT NO. : 10,103,351 B1  
APPLICATION NO. : 15/808775  
DATED : October 16, 2018  
INVENTOR(S) : Hong Li et al.

Page 1 of 1

It is certified that error appears in the above-identified patent and that said Letters Patent is hereby corrected as shown below:

In the Specification

Column 12, Line 60:  
Delete "w"  
Insert --w1--

Signed and Sealed this  
Eighteenth Day of June, 2019

Andrei Iancu  
*Director of the United States Patent and Trademark Office*